(12) United States Patent
Akif et al.

(10) Patent No.: US 10,060,422 B2
(45) Date of Patent: Aug. 28, 2018

(54) DEVICE AND ARRANGEMENT FOR GENERATING A FLOW OF AIR

(71) Applicant: Siemens Aktiengesellschaft, Munich (DE)

(72) Inventors: Oztzan Akif, Munich (DE); Randolf Mock, Hohenbrunn (DE); Thomas Vonz, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 275 days.

(21) Appl. No.: 14/407,001

(22) PCT Filed: Jun. 4, 2013

(86) PCT No.: PCT/EP2013/061477
§ 371 (c)(1),
(2) Date: Dec. 10, 2014

(87) PCT Pub. No.: WO2013/186084
PCT Pub. Date: Dec. 19, 2013

(65) Prior Publication Data
US 2015/0109732 A1 Apr. 23, 2015

(30) Foreign Application Priority Data

Jun. 15, 2012 (DE) .................. 10 2012 210 127

(51) Int. Cl.
*F04B 45/047* (2006.01)
*H01L 41/09* (2006.01)
(Continued)

(52) U.S. Cl.
CPC ............ *F04B 35/04* (2013.01); *F04B 43/046* (2013.01); *F04B 43/095* (2013.01);
(Continued)

(58) Field of Classification Search
CPC .. B05B 17/0646; F04B 43/046; F04B 45/047; F04B 35/04; F04B 43/095; H05K 7/20136; H01L 41/09; F04F 7/00
(Continued)

(56) References Cited

U.S. PATENT DOCUMENTS 4,393,979 A * 7/1983 Ball ..................... B65D 17/506
220/270
4,533,082 A * 8/1985 Maehara ............. B05B 17/0646
239/102.2

(Continued)

FOREIGN PATENT DOCUMENTS

CN 1365599 8/2002
CN 2903476 5/2007
(Continued)

*Primary Examiner* — Nathan Zollinger
(74) *Attorney, Agent, or Firm* — Cozen O'Connor

(57) ABSTRACT

A device for generating a flow of air, particularly for cooling electronic components, with an annular piezo element and an emitter element, wherein the annular piezo element can be vibrated radially by applying an alternating voltage, the emitter element is coupled radially to the annular piezo element, and wherein the radial vibration of the annular piezo element is configured so as to set the emitter element into axial vibration to generate the air flow which thereby permits a device of small dimensions for generating the an air flow to be created that is simultaneously characterized by low energy consumption and a long service life.

11 Claims, 3 Drawing Sheets

(51) Int. Cl.
  *F04B 35/04* (2006.01)
  *F04B 43/04* (2006.01)
  *F04B 43/09* (2006.01)
  *F04F 7/00* (2006.01)
  *H05K 7/20* (2006.01)
(52) U.S. Cl.
  CPC .............. *F04B 45/047* (2013.01); *F04F 7/00* (2013.01); *H01L 41/09* (2013.01); *H05K 7/20136* (2013.01)
(58) Field of Classification Search
  USPC ....................................................... 417/413.2
  See application file for complete search history.

(56) References Cited

U.S. PATENT DOCUMENTS

| | | | |
|---|---|---|---|
| 4,605,167 A * | 8/1986 | Maehara | B05B 17/0646 239/102.2 |
| 4,864,918 A * | 9/1989 | Martin | F04B 43/0054 92/103 R |
| 7,550,034 B2 | 6/2009 | Janse Van Rensburg et al. | |
| 7,553,135 B2 * | 6/2009 | Cho | F04B 43/046 361/688 |
| 2006/0201327 A1 * | 9/2006 | Janse Van Rensburg | F04B 43/0027 96/4 |
| 2006/0232167 A1 * | 10/2006 | Jordan | F04B 43/0054 310/324 |
| 2009/0174999 A1 * | 7/2009 | Sauciuc | G06F 1/20 361/679.48 |

FOREIGN PATENT DOCUMENTS

| | | |
|---|---|---|
| CN | 101568728 | 10/2009 |
| CN | 202134530 | 2/2012 |
| DE | 19539020 A1 | 4/1997 |
| DE | 602004002207 T2 | 12/2006 |
| DE | 102008038549 A1 | 3/2010 |
| DE | 102010042599 A1 | 4/2012 |
| WO | WO 0062589 A2 | 10/2000 |

* cited by examiner

DEVICE AND ARRANGEMENT FOR GENERATING A FLOW OF AIR

REFERENCE TO RELATED APPLICATIONS

This is a U.S. national stage of application No. PCT/EP2013/061477 filed 4 Jun. 2013. Priority is claimed on German Application No. 102012210127.6 filed 15 Jun. 2012, the content of which is incorporated herein by reference in its entirety.

BACKGROUND OF THE INVENTION

1. Field of the Invention

The present invention relates to an arrangement and device for generating a flow of air to cool electronic components.

2. Description of the Related Art

DE 10 2008 038 549 A1 discloses a device for generating a flow of air. This conventional device comprises a piezo element and an emitter element. The piezo element excites the emitter element to undergo oscillations, as a result of that a flow of air is generated which cools electronic components. This type of device has, in comparison with known cooling devices, such as rotational valves or passive heat sinks, the advantage that it is small, runs quietly and, furthermore, has a long service life.

SUMMARY OF THE INVENTION

It is an object of the present invention to provide a further improved device for generating a flow of air, which device is distinguished, in particular, by the fact that it has even smaller dimensions and can preferably be better integrated into planar structures, such as printed circuit boards.

This and other objects and advantages are achieved in accordance with the invention by providing a device for generating a flow of air, in particular for cooling electronic components, having an annular piezo element and an emitter element. The piezo element can be made to undergo radial oscillation via application of an alternating voltage. The emitter element is coupled radially to the piezo element. The radial oscillation of the piezo element is configured to cause the emitter element to undergo axial oscillation for generating the flow of air.

As a result of the combination of the radially oscillating piezo element and axially oscillating emitter element, the device can be provided with very compact dimensions. Above all, it is possible thereby to ensure that the device preferably extends essentially only in one plane, and specifically in the plane of the annular piezo element.

The coupling between the piezo element and the emitter element is produced such that it transmits the radial oscillation of the piezo element to the emitter element, with the result that the emitter element is made to undergo axial oscillation. For example, the coupling is formed as a connection that is positively locking in at least one direction. Alternatively, a materially joined or frictionally locking connection can be provided.

The piezo element is preferably connected to the emitter element directly, i.e., immediately. The piezo element can be formed, for example, as a piezo-electric stack (referred to as a "multi-layer") or piezo-electric monolith.

"Radial" and "axial" relate here to a central axis of the annular piezo element. The piezo element is preferably formed in a rotationally symmetrical manner with respect to the central axis. The piezo element is preferably formed in a circular-ring-shaped manner. The corresponding ring of the piezo element can have a rectangular cross section.

The alternating voltage is preferably in the region of the resonant frequency of the device.

In accordance with one embodiment, the piezo element has an axial opening that closes off the emitter element. "Closing off" includes here a partial or complete closing off. For example, in the first case the emitter element can have one or more, in particular, small openings if this is expedient.

The axial opening permits the emitter element to oscillate freely relative to the piezo element, i.e., in the region of the axial opening there is no direct connection between the emitter element and the piezo element.

In accordance with a further embodiment, the emitter element has a radial section and an axial section. While the radial section is configured to perform the axial oscillation of the emitter element, the coupling of the emitter element to the piezo element occurs via the axial section. That is, in particular, the radial oscillations from the piezo element are directed into the emitter element and on to the radial section via the axial section, and specifically in such a way that the radial section is made to undergo axial oscillation.

In accordance with a further embodiment, the radial section is formed as a disc and/or the axial section is formed as a pipe. The disc is preferably formed in a circular manner. The pipe preferably has a circular-ring-shaped cross section.

In accordance with a further embodiment, the emitter element is inserted at least partially into the opening. Alternatively, the piezo element can be inserted at least partially into the emitter element. Both of the abovementioned embodiments give rise to further saving in their space.

In accordance with yet a further embodiment, the axial section of the emitter element extends made the axial opening of the piezo element. Alternatively, the piezo element is arranged in the axial section of the emitter element. Both embodiments permit good inputting of the radial oscillation of the piezo element into the emitter element.

In accordance with a further embodiment, the radial and axial sections connect to one another (i.e., interconnect) over a first radius. This reduces stresses in the emitter element, which permits a longer service life of the device, which may be, for example, longer than 30,000 hours. Furthermore, as a result of the first radius the rigidity of the emitter element in the region of the conduction through of the oscillation between the axial section and the radial section is influenced such that an amplitude in the central region of the radial section can be increased in the axial direction. This increasing of the amplitude permits a stronger flow of air, for example, with a speed in the range from 0.2 m/s to be achieved. However, the electrical energy which has to be expended for this purpose is advantageously small.

In accordance with a further embodiment, the first radius is located in an inner or outer region of the emitter element. The radial and axial section of the emitter element together define an inner region, i.e., a cavity. Correspondingly, the radial and axial section together define an outer region which is located on the outside with respect to the inner region.

In accordance with a further embodiment, the radial and axial section form, when viewed in cross section, a U shape. In this case, it is preferable to provide the first radius in the inner region of the emitter element.

In accordance with another embodiment, the axial and radial section adjoin one another in a T shape when viewed in cross section. In this case, the first radius is preferably provided in the outer region of the emitter element.

In accordance with a further embodiment, the emitter element is supported axially on the piezo element by means of a radial web. This measure can also influence the rigidity of the emitter element to the effect that a larger amplitude can be achieved in the central region of the radial section.

In yet a further embodiment, the web is arranged in an outer region of the emitter element. The statements above relating to the emitter element apply with respect to the "outer region".

The web extends in the radial direction preferably only over a partial region of the piezo element. For example, the web overlaps the piezo element in the radial direction by less than half, preferably by less than a third, and more preferably by less than a quarter of the extent of the piezo element in the radial direction.

In accordance with a further embodiment, the web adjoins the radial section of the emitter element over a second radius. This measure also permits the rigidity of the emitter element to be influenced to the effect that a larger amplitude is achieved in the central region of the radial section.

In accordance with an even further embodiment, the web adjoins the axial section of the emitter element in a sharp-edged manner. The term "sharp-edged manner" is understood here to mean a radius of less than 0.05 mm, preferably less than 0.02 mm. This advantageously also influences the rigidity of the emitter element with respect to a relatively large amplitude.

In accordance with a further embodiment, a resonant frequency of the device is at least 30 kHz. The resonant frequency is preferably higher than 100 kHz and further preferably higher than 1 MHz. These high frequencies can be achieved by virtue of the particular configuration of the device. The device is therefore preferably provided for generating ultrasonic sound.

In accordance with a further embodiment, a total diameter of the device is in the range between 2 and 100 mm, preferably between 15 and 35 mm. The term "total diameter" refers here to the maximum dimension of the device. The first and/or second radius is 0.05 to 15 mm, more preferably 0.5 to 3.5 mm. Depending on the resonant frequency and total diameter of the device first and second radii are selected so as to make it possible to achieve large amplitudes with simultaneously long service life and low energy consumption of the device.

In accordance with a further embodiment, the emitter element is constructed at least partially from metal or plastic. Plexiglass or hard PVC are possible as the plastic. Aluminum is particularly well suited as the metal. In addition, it is also conceivable to use metals such as copper, brass, steel or titanium.

Furthermore, an arrangement having at least one electronic component and at least one device in accordance with the invention is made available. The device is configured to generate a flow of air that cools the electronic component.

For example, the arrangement can have a circuit board that comprises the electronic component. The device can be attached to the circuit board. Furthermore, the device can be integrated into the circuit board. The main plane of extent of the device can be arranged parallel to or congruently with the main plane of extent of the circuit board, here. The term "main plane of extent of the device" is meant here to mean the plane of the device in which the piezo element extends.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Advantageous refinements of the invention are explained in more detail below with reference to the appended drawings, in which.

DETAILED DESCRIPTION OF THE EXEMPLARY EMBODIMENTS

In the figures, identical reference symbols denote identical or functionally identical elements unless stated otherwise.

Figure 1:
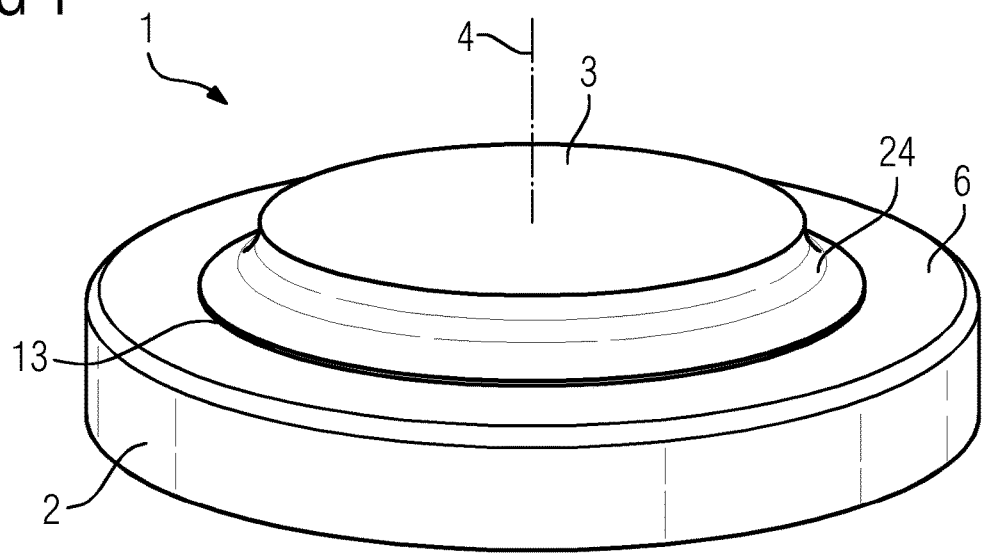
FIG. 1 shows a perspective view of a device in accordance with an embodiment of the invention from obliquely above.
Figure 2:
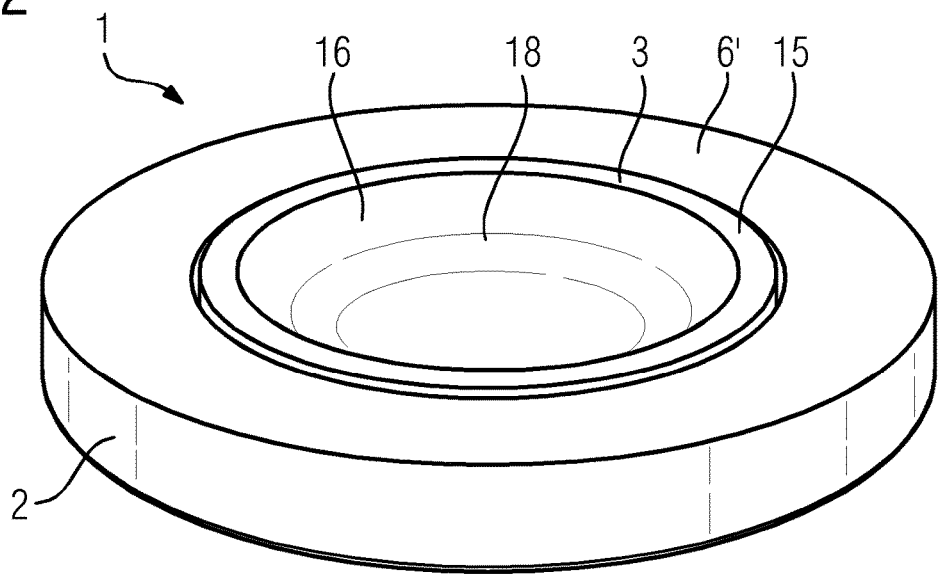
FIG. 2 shows the device of FIG. 1 viewed from obliquely below.
Figure 3:
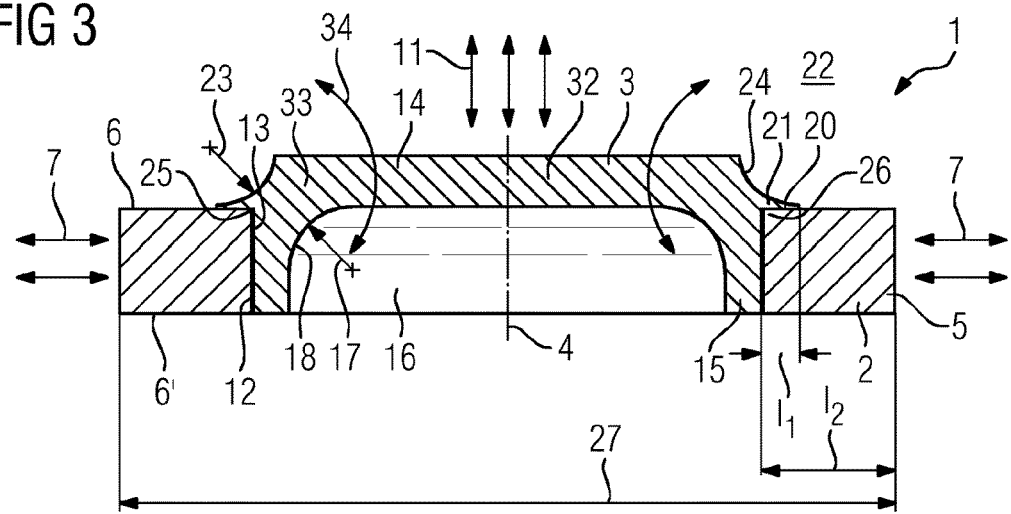
FIG. 3 shows a sectional view of the device of FIG. 1.
Figure 4:
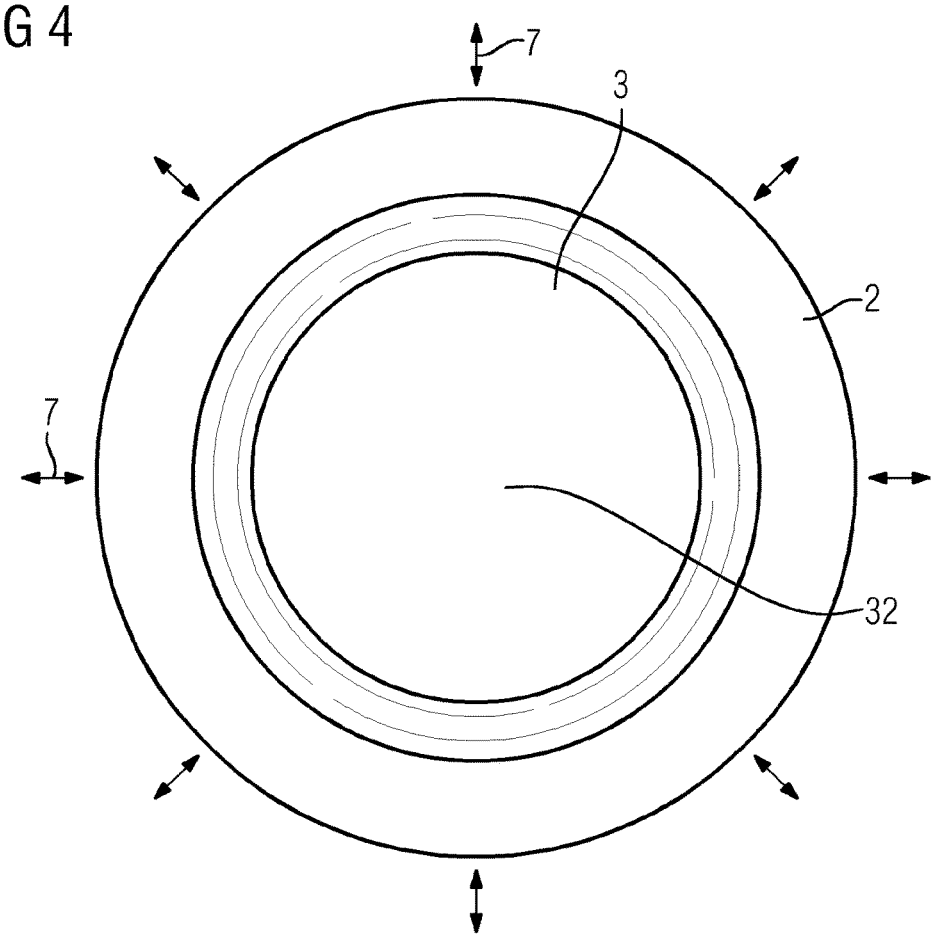
FIG. 4 shows a plan view of the device of FIG. 1.

A device 1 for generating a flow of air, in particular for cooling electronic components, will be explained below in more detail with reference to FIGS. 1 to 4. Here, FIG. 1 shows an oblique view of the device 1 from above, FIG. 2 shows an oblique view from below, FIG. 3 shows a sectional view and FIG. 4 shows a plan view.

The device 1 comprises an annular piezo element 2 and an emitter element 3.

In accordance with the exemplary embodiment, the piezo element is formed in a circular-ring-shaped manner, i.e., in a rotationally symmetrical manner with respect to a central axis 4. The piezo element 2 can have a rectangular cross section 5, as can be seen in FIG. 3. The piezo element 2 is preferably formed as a piezo electric stack. The piezo element 2 can be composed partially or completely from a ceramic. An alternating voltage can be applied to the piezo element 2, in particular to axial end faces 6, 6' lying opposite one another (see FIGS. 1 and 2). Here, the terms "axial" and "radial" relate to the central axis 4. The application of the alternating voltage causes the piezo element 2 to undergo radial oscillation, as indicated in FIG. 3 by corresponding arrows 7. The alternating voltage has, for example, a frequency of 100 kHz, which also corresponds to the resonant frequency of the device 1.

The emitter element 3 is radially coupled to the piezo element 2. This coupling permits the radial oscillation of the piezo element 2 to be input into the emitter element 3, which causes the emitter element 3 to undergo axial oscillation (indicated in FIG. 3 by the arrows 11). The axial oscillation of the emitter element 3 then generates the flow of air for cooling the electronic components.

For example, the emitter element 3 can be connected to the piezo element 2 in a radially positively locking manner in at least one direction (but not in the opposing direction according to one embodiment). As is apparent in FIG. 3, such a positively locking connection can be provided radially on the inside, which means that if the piezo element 2 contracts, it presses from the outside against the emitter element 3, as a result of which the emitter element is compressed radially. In addition, the emitter element 3 can, for example, be connected in a materially joined manner to the piezo element 2. Such a material joint between the emitter element 3 and the piezo element 2 can be formed, for example, by pouring the emitter element 3 (in the event of the emitter element 3 being manufactured from metal or plastic) into the piezo element 2. In this context, the adhesive forces act between the piezo element 2 and the emitter element 3 in the radial direction. Alternatively, an auxiliary material, such as an adhesive, can be introduced between the emitter element 3 and the piezo element 2, for example, into the gap denoted by 12 in FIG. 3. The auxiliary material then ensures that the connection occurs in the radial direction, in this case, radially toward the inside and radially toward the outside. The emitter element 3 could also be clamped into the piezo element 2, in particular shrink-fitted therein.

The emitter element 3 closes off an axial opening 13 of the piezo element 2 completely. For this purpose, the emitter element 3 is inserted partially into the opening 13. The emitter element 3 has a radial section 14 in the form of a circular disc and an axial section 15 in the form of a tube with a circular cross section (see FIG. 2).

The two sections 14, 15 are preferably formed integrally with one another. The radial section 14 extends axially in front of (or above in the view in FIG. 3) the piezo element 2. In contrast, the axial section 15 extends within the axial opening 13 of the piezo element 2.

The radial and axial section 14, 15 jointly define an inner region 16, i.e., a cavity (see FIGS. 2 and 3). The radial and axial section 14, 15 adjoin one another over a first radius 17, as a result of which a rounded portion 18 is produced. The first radius 17 is located in the inner region 16 of the emitter element 3.

The emitter element 3 also has a radial web 21. The emitter element 3 is axially supported on the piezo element 2 via the web 21. In particular, the web 21 bears against the end side 6 of the piezo element 2. As is apparent in FIG. 3, the web 21 extends radially with a length 11 over the cross section 5 of the piezo element 2. Here, the length 11 is only a fraction, such as less than a third, of the total length 12 of the cross section 5 in the radial direction, with the result that a small bearing face 20 of the web 21 is produced in the piezo element 2. The web 21 is arranged in an outer region 22 of the emitter element 3, i.e., outside the inner region 16. In particular, the web 21 extends radially away from the axial section 15. The web 21 adjoins the radial section 14 of the emitter element 3 over a second radius 23, as a result of which a rounded portion 24 is produced. Here, the two radii 17, 23 are each produced such that they curve inwardly, i.e., into the emitter element 3, or are produced in a convex manner.

Furthermore, the rounded portions 18, 24 are preferably produced such that they extend around in a circular manner (with respect to the central axis 4). The web 21 adjoins the axial section 15 in a sharp-edged manner (a corresponding edge is denoted by 25 in FIG. 3). The cross section 5 of the piezo element 2 is formed in a corresponding manner, i.e., a corresponding edge 26 engages in the corresponding cutout.

In accordance with the present embodiment, the resonant frequency of the device 1 is, for example, 100 kHz. The total diameter 27 of the device is, for example, 23 mm. The first radius 17 is, for example, 2.0 mm, and the second radius 23 is, for example, 1.4 mm.

During operation of the device 1, the small bearing face 20 of the emitter element 3 on the piezo element 2 and the rounded portions 18, 24 at the radially outer edge of the emitter element 3 cause a large amplitude (indicated by the arrows 11) in a central region 32 of the radial section 14 of the emitter element 3 to be produced. In particular, in this way a through-conducting region 33 for conducting the radial oscillation 7 through to the central region 32 is produced, which through-conducting region 33 ensures that there is a large amplitude during a simultaneously long service life and low energy requirement. The corresponding twisting of the radial section with respect to the axial section 15 is indicated in FIG. 3 by arrows 34. The amplitude of the central region 32 gives rise in turn to an air flow with a speed of, for example, 0.2 m/s, which is suitable for cooling electronic components.

A device 1 according to a further embodiment will be explained on the basis of FIG. 5, which shows a section similar to the section from FIG. 3.

Figure 5:
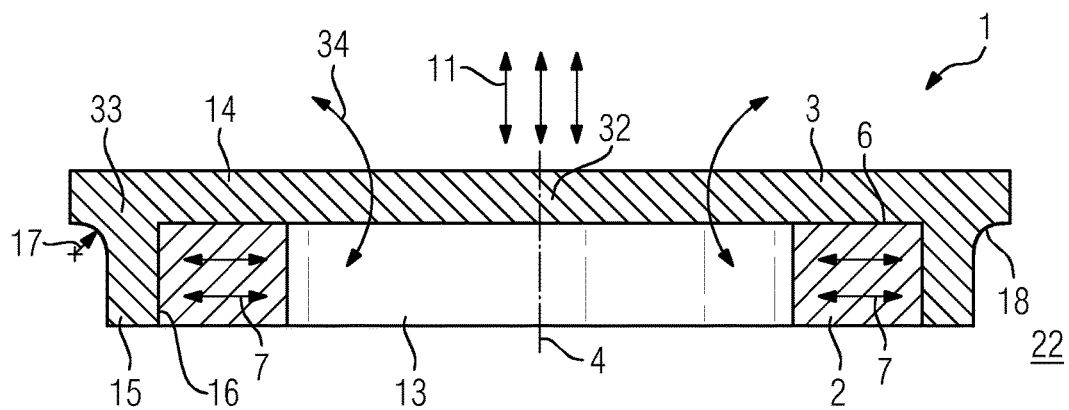
FIG. 5 shows a sectional view of the device in accordance with a further embodiment.

The exemplary embodiment depicted in FIG. 5 differs from that of FIGS. 1 to 4 in particular in that the piezo element 2 is arranged in the inner region 16 which is defined by the radial section 14 and the axial section 15. If the piezo element 2 oscillates radially (indicated by the arrow 7), the latter presses radially outward against the axial section 15 owing to the existing positive locking.

While in the exemplary embodiment of FIG. 3 the radial and axial section 14, 15 of the emitter element 3 form a U shape when viewed in cross section, in the exemplary embodiment depicted in FIG. 5 they adjoin one another in a T shape when viewed in cross section, with the result that the first radius 17 or the corresponding rounded portion 18 is in the outer region 22. The radial section 14 of the emitter element 3 extends both over the opening 13 and over the end face 6 of the piezo element 2. In particular, the end face 6 bears (from below when viewed in FIG. 5) against the radial section 14 in the inner region 16. The embodiment in accordance with FIG. 5 has the advantage that thermal expansion of the piezo element 2 does not have any negative effects either over a long service life.

Figure 6:
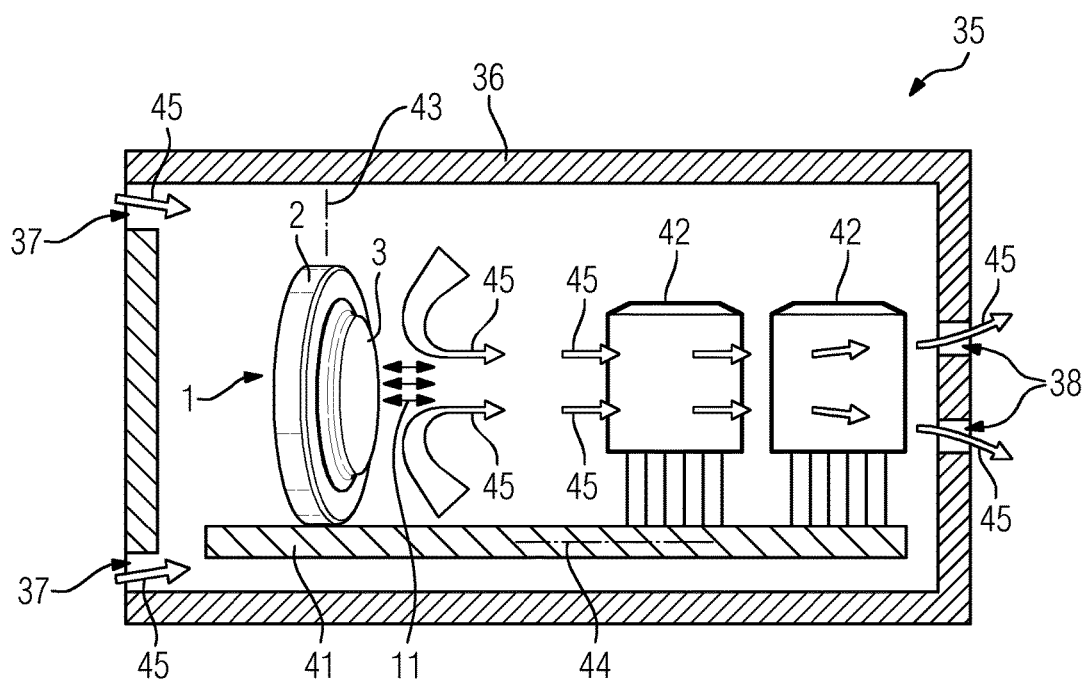
FIG. 6 shows an arrangement in accordance with an embodiment along with the device of FIG. 1.

FIG. 6 shows a sectional view of an arrangement 35 in accordance with an embodiment.

The arrangement 35 comprises, for example, a housing 36 with air inlet openings 37 and air outlet openings 38. A circuit board 41, which has a plurality of electronic components, for example, light-emitting diodes (LEDs) 42 are arranged in the interior of the housing 36. Furthermore, the device 1 that is described in FIGS. 1 to 4 is mounted on the circuit board 41. Alternatively, the device 1 described in FIG. 5 can also be provided.

The device 1 can either extend with its main plane 43 of extent perpendicular to the main plane 44 of extent of the circuit board 41, as illustrated in FIG. 6. Alternatively, the device 1 can extend with its main plane 43 of extent parallel to the main plane 44 of extent of the circuit board 41, where the device 1 can be integrated in a planar manner into the circuit board 41.

As a result of the oscillation of the emitter element 3 (indicated by the arrows 11), a stream 45 of air is produced, with the result that air entering through the air inlet openings 37 is carried past the LEDs 42, and cools the LEDs 42 in the process. After this, the air again passes out of the housing 36 through the air outlet openings 38.

Although the invention has been described here on the basis of exemplary embodiments, it is in no way restricted thereto but rather can be modified in a variety of ways.

For example, instead of the LEDs 42 other power electronics can also be cooled.

The device 1 can also be used as a sound generator (transmitter) in the ultrasonic range owing to the particularly high sound intensities that are achieved by the design.

The device 1 can be used such that the sound generated thereby breaks up boundary layers around objects, in particular electronic components, to be cooled and in this way brings about the cooling through improved convection.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A device for generating a stream of air to cool electronic components, comprising:
    an annular piezo element which is radially oscillated via application of an alternating voltage; and
    an emitter element having a radial section and an axial section which are interconnected over a first radius formed as a rounded portion, said emitter element being radially coupled to the piezo element and supported axially on the annular piezo element via a radial web which adjoins the radial section of the emitter element over a second radius formed as a second rounded portion, the first and second rounded portions being produced in a convex manner;
    wherein the radial oscillation of the annular piezo element is configured to cause the emitter element to axially oscillate to generate the stream of air to cool the electronic components.

2. The device as claimed in claim 1, wherein the annular piezo element has an axial opening which is closed off by the emitter element.

3. The device as claimed in claim 1, wherein at least one of (i) the radial section is formed as a disc and (ii) the axial section is formed as a pipe.

4. The device as claimed in claim 2, wherein the emitter element is inserted at least partially into the axial opening.

5. The device as claimed in claim 4, wherein the axial section of the emitter element extends inside the opening of the annular piezo element.

6. The device as claimed in claim 1, wherein the first radius is located in an inner region of the emitter element.

7. The device as claimed in claim 1, wherein the web is arranged in an outer region of the emitter element.

8. The device as claimed in claim 1, wherein the web adjoins the axial section of the emitter element in a flattened manner.

9. The device as claimed in claim 1, wherein a resonant frequency thereof is in a range between 30 kHz and 1 MHz, and at least one of (a) a total diameter thereof is in a range between 2 mm and 100 mm and (b) at least the first radius and (ii) the second radius is in a range between 0.05 mm to 15 mm.

10. The device as claimed in claim 1, wherein the emitter element is constructed at least partially from one of (i) metal and (ii) plastic.

11. An arrangement comprising:
    at least one electronic component; and
    at least one device configured to generate a stream of air to cool the at least one electronic component, the device comprising:
        an annular piezo element which is radially oscillated via application of an alternating voltage; and
        an emitter element having a radial section and an axial section which are interconnected over a first radius formed as a rounded portion, said emitter element being radially coupled to the annular piezo element and supported axially on the annular piezo element via a radial web which adjoins the radial section of the emitter element over a second radius formed as a second rounded portion, the first and second rounded portions being produced in a convex manner;
    wherein the radial oscillation of the annular piezo element is configured to cause the emitter element to axially oscillate to generate the stream of air to cool the at least one electronic component.

* * * * *